United States Patent
Guiney et al.

(10) Patent No.: US 7,323,116 B2
(45) Date of Patent: Jan. 29, 2008

(54) METHODS AND APPARATUS FOR MONITORING A PROCESS IN A PLASMA PROCESSING SYSTEM BY MEASURING SELF-BIAS VOLTAGE

(75) Inventors: Timothy J. Guiney, Battle Ground, WA (US); Rao Annapragada, Union City, CA (US); Subhash Deshmukh, Vancouver, WA (US); Chia Cheng Cheng, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/951,553

(22) Filed: Sep. 27, 2004
(Under 37 CFR 1.47)

(65) Prior Publication Data

US 2006/0065623 A1    Mar. 30, 2006

(51) Int. Cl.
*G01R 31/00*    (2006.01)
(52) U.S. Cl. .................... 216/61; 216/59; 438/14; 438/16
(58) Field of Classification Search .............. 216/59, 216/61; 118/724; 438/14, 17
See application file for complete search history.

(56) References Cited

U.S. PATENT DOCUMENTS

| | | | |
|---|---|---|---|
| 4,478,678 A | | 10/1984 | Watanabe |
| 5,427,827 A | * | 6/1995 | Shing et al. ................. 427/577 |
| 5,557,215 A | * | 9/1996 | Saeki et al. ................. 324/765 |
| 5,699,223 A | | 12/1997 | Mashiro et al. |
| 5,863,376 A | | 1/1999 | Wicker et al. |
| 6,063,234 A | | 5/2000 | Chen et al. |
| 6,123,775 A | | 9/2000 | Hao et al. |
| 6,197,116 B1 | * | 3/2001 | Kosugi ....................... 118/712 |
| 6,302,966 B1 | | 10/2001 | Bailey, III et al. |
| 6,361,645 B1 | * | 3/2002 | Schoepp et al. ............ 361/234 |
| 6,372,523 B1 | * | 4/2002 | Suzawa et al. ................ 438/5 |
| 2003/0150562 A1 | * | 8/2003 | Quon ..................... 156/345.47 |
| 2005/0230049 A1 | * | 10/2005 | Nishio et al. .......... 156/345.51 |
| 2006/0065631 A1 | * | 3/2006 | Cheng et al. ................. 216/86 |
| 2006/0065632 A1 | * | 3/2006 | Cheng et al. ................. 216/86 |

OTHER PUBLICATIONS

International (PCT) Search Report, mailed Oct. 20, 2006, regarding PCT/US2005/34227.
Written Opinion mailed Oct. 20, 2006 regarding PCT/US2005/34227.

(Continued)

*Primary Examiner*—Shamim Ahmed
(74) *Attorney, Agent, or Firm*—IP Strategy Group, P.C.

(57) ABSTRACT

A method for in-situ monitoring a process in a plasma processing system having a plasma processing chamber is disclosed. The method includes positioning a substrate in the plasma processing chamber. The method also includes striking a plasma within the plasma processing chamber while the substrate is disposed within the plasma processing chamber. The method further includes obtaining a measured self-bias voltage that exists after the plasma is struck, the measured self-bias voltage value having a first value when the plasma is absent and at least a second value different from the first value when the plasma is present. The method also includes correlating the measured self-bias voltage value with an attribute of the process, if the measured self-bias voltage value is outside of a predefined self-bias voltage value envelope.

32 Claims, 8 Drawing Sheets

OTHER PUBLICATIONS

"Thermal Mass," A Powerpoint presentation, 21 pages, no date provided.

"Frequency Scanning V/I Probe: Models VI-Probe-4100 And VI-Probe-350 RF Impedance Analyzer," pp. 1-4, 2003 MKS Instruments, Inc., Bulletin V/I Probe-4/03, www.mksinst.com.

Commenant et al. "Faraday Shield Disposed within an Inductively Coupled Plasma Etching Apparatus," pp. 1-55, no date provided.

"Chapter 2 : Statistical Process Control," pp. 13-34, no date provided.

Hung et al. "The More and Less of Effective Overlay Control," Summer 2003, Yield Management Solutions, pp. 59-64.

"SEMI Draft Doc.#3814: New Standards: Safety Guideline for FPD Manufacturing System," Apr. 2, 2004, SEMI International Standards, pp. 1-47.

"O: RC & RL Frequency Response," pp. 0-1-0.17, no date provided.

Amorese, Greg, "LCR/Impedance Measurement Basics," Hewlett-Packard Company 1997, 1997 Back to Basics Seminar, 81 pages.

El-Hag, Ayman H., "Lecture Notes: ME 269—Single Phase Circuit," Dec. 16, 2003, 19 pages.

Hirscher, Hans, "Electrostatic Chuck to Boost Your Yield," Silicon Front End, pp. 39-43, no date provided.

U.S. Appl. No. 10/951,548, filed Sep. 27, 2004, Cheng et al.

U.S. Appl. No. 10/952,562, filed Sep. 27, 2004, Cheng et al.

IPRP (Int'l Preliminary Report on Patentability) mailed Apr. 5, 2007 re PCT/US2005/034227.

\* cited by examiner

METHODS AND APPARATUS FOR MONITORING A PROCESS IN A PLASMA PROCESSING SYSTEM BY MEASURING SELF-BIAS VOLTAGE

BACKGROUND OF THE INVENTION

The present invention relates in general to substrate manufacturing technologies and in particular to methods and apparatus for monitoring a process in a plasma processing system by measuring self-bias voltage.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Referring now to FIG. 1, a simplified diagram of a capacitively coupled plasma processing system is shown. Generally, capacitively coupled plasma processing systems may be configured with a single or with two separate RF power sources. Source RF, generated by source RF generator 134, is commonly used to generate the plasma as well as control the plasma density via capacitively coupling. While bias RF, generated by bias RF generator 138, is commonly used to control the DC bias and the ion bombardment energy. Further coupled to source RF generator 134 and bias RF generator 138 is matching network 136, that attempts to match the impedance of the RF power sources to that of plasma 110. In addition, matching network 136 may also include a V/I probe (not shown) that can measure the voltage and impedance of a current transmitted to plasma 110, as well as the ability to modify a generated plasma frequency in order to better optimize the plasma to process conditions.

Generally, an appropriate set of gases is flowed into chamber 102 through an inlet in a top electrode 104 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116, which also serves as an electrode Commonly, a cooling system 140 is coupled to electrostatic chuck 116 in order to achieve thermal equilibrium once the plasma is ignited. The cooling system itself is usually comprised of a chiller that pumps a coolant through cavities in within the chuck, and helium gas pumped by pump 111 between the chuck and the substrate (e.g., backside He Flow). In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs.

In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole. Generally, an opening is formed in a dielectric layer, usually lined with a TaN or TiN barrier, and then subsequently filled with a conductive material (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of silicon nitride is then deposited to cap the copper.

However, in these and other plasma processes, it is often difficult to determine exactly when process conditions change beyond established parameters. In particular, as device dimensions shrink and more advanced low k materials are used, the requirements for substantially stable process conditions become even more stringent in order to maintain a uniform etch rate, improve yield, etc.

Contamination, in particular, tends to present a substantial problem. The degree of contamination is usually dependent on the specific plasma process (e.g., chemistry, power, and temperature) and the initial surface condition of chamber. Since fully removing deposits may be time consuming, a plasma processing system chamber is generally only substantially cleaned when the particle contamination levels reach unacceptable levels, when the plasma processing system must be opened to replace a consumable structure (e.g., edge ring, etc.), or as part of scheduled preventive maintenance (PM).

Likewise, hardware deterioration also tends to be problematic. As plasma chamber components are exposed to the plasma, they themselves may become damaged, altering mechanical and electrical characteristics, as well as producing contaminants. In fact, the cleaning process itself may damage the components, as with the electrostatic chuck (chuck) during waferless auto clean or (WAC).

Yet, there is generally no effective way to determine if a plasma process has moved outside of established parameters in-situ, without first initially processing and then subsequently testing partially manufacturing substrates. That is, after a batch of substrates has been processed, a sample substrate is removed from the batch and tested. If the test determines that the substrate does not meet the established specification, the entire batch of substrates may need to be destroyed.

One solution may be to create a simplified empirical model of the plasma processing system in order to sufficiently capture the behavior of the tool. However, creating an empirical model may be problematic. For example, a modified non-operational plasma chamber may be analyzed in order to extract parameters for the simplified empirical. In another technique, the individual components of a plasma processing system may be individually measured using a network analyzer.

However, even a loosely correlated (and hence weakly predictive) model is difficult to obtain since repetition of the plasma process itself may effect of the electrical characteristics of plasma processing system components. The creation of simplified empirical models may only be done infrequently, and only by trained personnel.

In view of the foregoing, there are desired methods and apparatus for monitoring a process in a plasma processing system by measuring self-bias voltage.

SUMMARY OF THE INVENTION

The invention relates, in one embodiment, in a plasma processing system, to a method for in-situ monitoring a process in a plasma processing system having a plasma processing chamber. The method includes positioning a substrate in the plasma processing chamber. The method also includes striking a plasma within the plasma processing chamber while the substrate is disposed within the plasma processing chamber. The method further includes obtaining a measured self-bias voltage that exists after the plasma is struck, the measured self-bias voltage value having a first value when the plasma is absent and at least a second value different from the first value when the plasma is present. The method also includes correlating the measured self-bias voltage value with an attribute of the process, if the measured self-bias voltage value is outside of a predefined self-bias voltage value envelope.

The invention relates, in one embodiment, in a plasma processing system, to an apparatus for in-situ monitoring a process in a plasma processing system having a plasma processing chamber. The apparatus includes a means of positioning a substrate in the plasma processing chamber. The apparatus further includes a means of striking a plasma within the plasma processing chamber while the substrate is disposed within the plasma processing chamber. The apparatus also includes a means of obtaining a measured self-bias voltage that exists after the plasma is struck, the measured self-bias voltage value having a first value when the plasma is absent and at least a second value different from the first value when the plasma is present. If the measured self-bias voltage value is outside of a predefined self-bias voltage value envelope, the apparatus further includes a means of correlating the measured self-bias voltage value with an attribute of the process.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
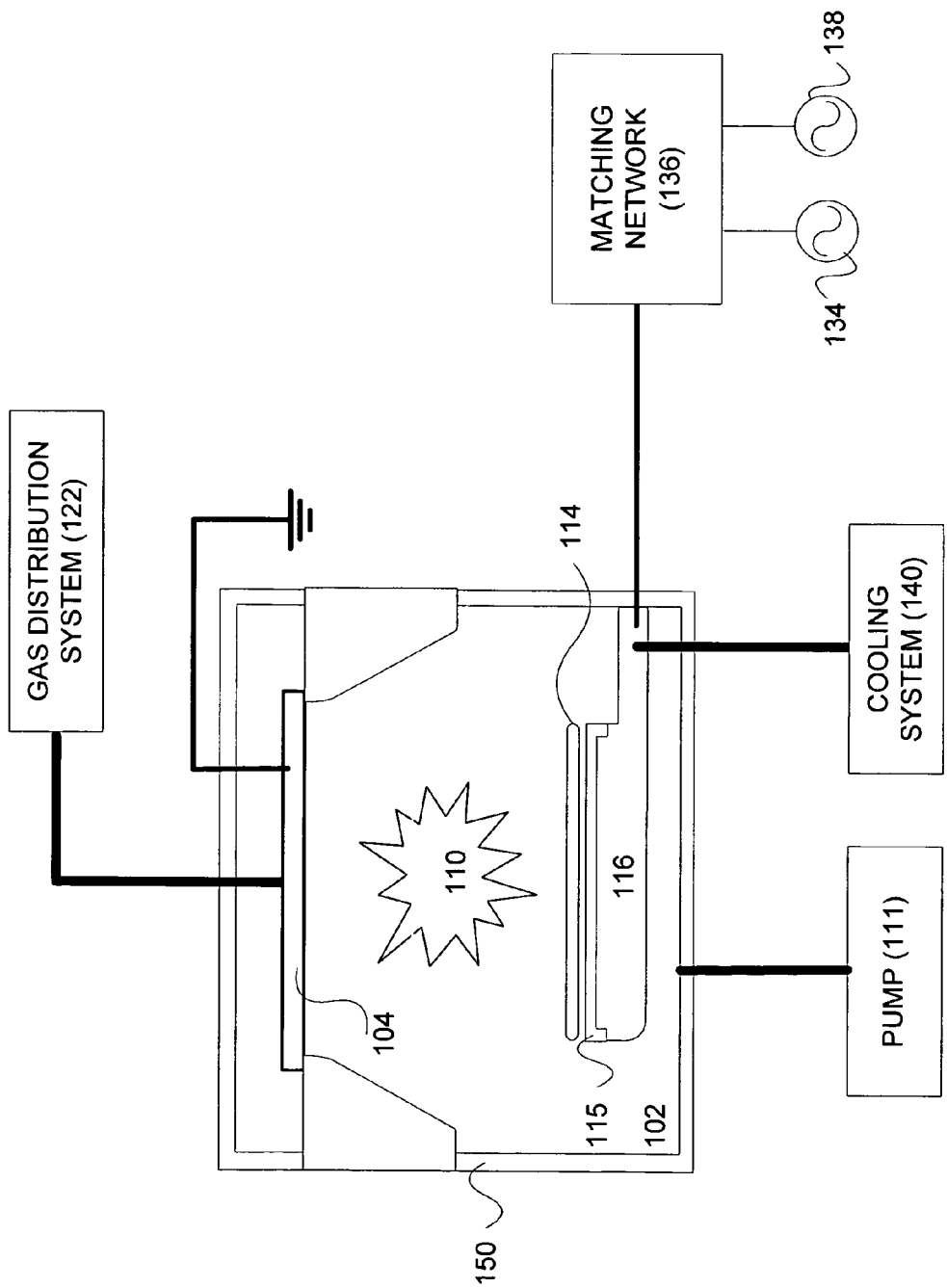
FIG. 1 shows a simplified diagram of a capacitively coupled plasma processing system.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a substantially easy-to-measure plasma parameter excursion can be correlated to a substantially difficult-to-measure substrate attribute excursion. Generally, an excursion represents a data point that is outside of an established statistical range or a value envelope. That is, an excursion may be a data point above a statistical upper control limit or below a statistical lower control limit. In a plasma process, any excursion that goes undetected or is not forestalled may place a significant amount of substrate material at risk.

For example, in the normal course of operation, plasma parameters are expected to remain within a particular range or value envelope (i.e., a set of impedances for each plasma frequency, a set of phase angles for each plasma frequency, a particular frequency range for each plasma frequency, a self-bias voltage, etc.). This range is often 3 standard deviations (or $3\sigma$) of some target or base line.

Standard deviation ($\sigma$) is generally the square root of the variance. It is the most commonly used measure of spread. In general, if the mean and standard deviation of a normal distribution are known, it is possible to compute the percentile rank associated with any given score (i.e., data point, etc.). In a normal distribution, about 68% of the scores are within one standard deviation of the mean, about 95% of the scores are within two standards deviations of the mean and about 99% of the scores are within three standards deviations of the mean.

$$\sigma = \Sigma(X-\mu)^2/N \qquad \text{(Equation 1)}$$

where X is a particular score, $\mu$ is the mean, and N is the number of scores.

However, plasma processing recipes are optimized for, and hence tend to be very sensitive to, the plasma parameters. Therefore, for a given problem in a plasma processing system, a substrate attribute excursion (i.e., improper etch rate, etc.) can be correlated to a plasma parameter excursion (i.e., impedance value greater than $3\sigma$ for a particular frequency, etc.). That is, a particular problem would also tend to cause a set of excursions in both the plasma as well as the substrate. Common plasma processing problems (and hence possible process excursions) include chamber contamination, plasma structural damage and deterioration, gas pressure leak, gas flow mixture problem, chamber temperature out of specification, bad RF cable, improperly connected cable, etc.

In one embodiment, a correlation can be determined between an excursion in the impedance of an RF power source at a particular frequency and a substrate attribute excursion (e.g., improper photoresist etch rate, etc.).

In another embodiment, a correlation can be determined between an excursion of a frequency in a frequency-tuned plasma system and a substrate attribute excursion (e.g., improper photoresist etch rate, etc.). In general, frequency-tuned plasma systems can modify a set of frequencies used to generate the plasma in order to minimize the reflected power during a process. As a result, the frequency changes as a response to the changes in plasma impedance.

In another embodiment, a correlation can be determined between an excursion in a phase angle of an RF power source at a particular frequency and a substrate attribute excursion (e.g., improper photoresist etch rate, etc.).

In another embodiment, a correlation can be determined between an excursion in a self-bias voltage and a substrate attribute excursion (e.g., improper photoresist etch rate, etc.).

Generally, an electric field must be generated just in front of the substrate (e.g., between the substrate and the plasma) which will allow plasma ions of sufficient energy to bombard the substrate. Commonly known as self-bias voltage, the greater the potential difference between it and the plasma discharge voltage, the greater the tendency of the substrate to attract plasma ions. However, since a voltage potential difference may also exist between the plasma discharge and other non-target surfaces in the plasma chamber, which may themselves divert the plasma ions from the substrate (i.e., chamber walls, upper electrode, etc.), the self-bias voltage must also have a substantially large potential difference to these surfaces. Subsequently, a problem that would tend to affect the plasma, and hence the substrate, would also tend to affect the self-bias voltage.

As previously described, plasma processing systems are often powered with some type of RF power source. Often, there is a source RF generator used to generate and control the plasma density, and a bias RF generator commonly used to control the plasma DC bias and the ion bombardment energy. These RF sources, in turn, are commonly coupled to the plasma through a matching network that attempts to match the impedance of the RF power sources to that of plasma.

In addition, matching network may also include a V/I probe that can measure voltage (V), current (I), phase angle ($\theta$) between the voltage (V) and current (I) of the plasma, impedance (Z), delivered power, forward power, reflected power, reactive power, reflection coefficient, etc. Furthermore, the matching network may also modify a generated plasma frequency within an established range value envelope in order to better optimize the plasma to process conditions. As previously state, a plasma processing system that can modify a set of frequencies used to generate the plasma is generally referred to as a frequency-tuned plasma system.

Delivered power can generally be derived as follows:

$$\text{Power} = V \times I \times \cos(\theta) \qquad \text{(Equation 2)}$$

Impedance, a complex number, can generally be derived as:

$$Z = V_0/I_0 = R + jX \qquad \text{(Equation 3)}$$

where $V_0$ is the voltage at fundamental (peak voltage), $I_0$ is the current at fundamental (peak current), R is the real resistance, j=sqrt(−1) (the imaginary part of a complex number), and X is the complex reactance. Complex reactance is an expression of the extent to which an electronic component, stores and releases energy as the current and voltage fluctuate with each AC cycle of the generated signal with a angular frequency denoted by $\omega$.

$\omega$ is the angular frequency of the signals generated by the voltage sources, and can be represented in the form of:

$$\omega = 2\pi(\text{Frequency}) \qquad \text{(Equation 4)}$$

The phase angle of the plasma impedance can be represented in the form of:

$$\text{Phase Angle } (\theta) = \tan^{-1}(X/R) \qquad \text{(Equation 5)}$$

where $R = Z \cos(\theta)$ and $X = Z \sin(\theta)$.

Figure 2:
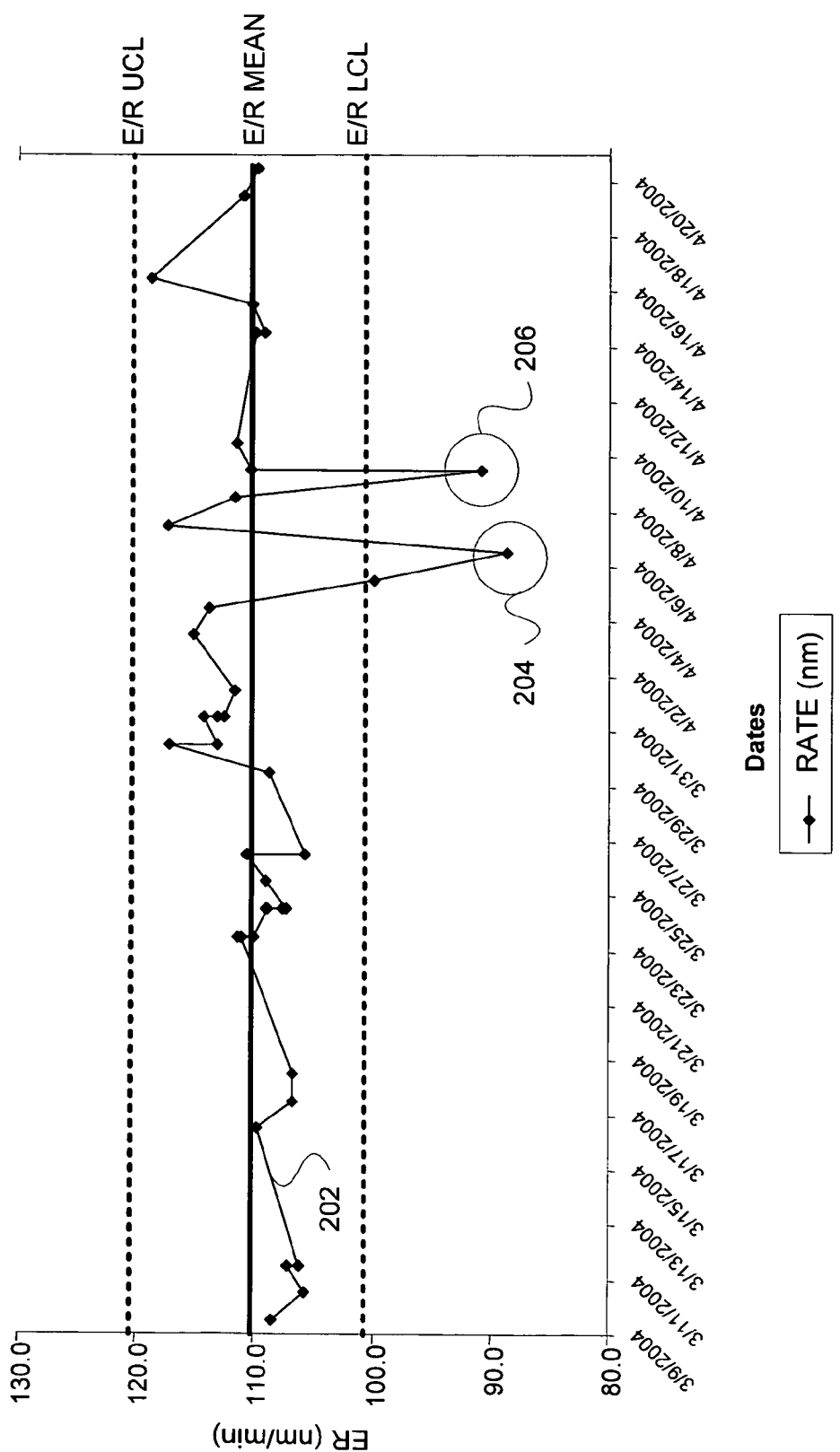
FIG. 2 shows a simplified statistical process control diagram of a set of blanket oxide etches in a particular same plasma processing system, according to one embodiment of the invention.

Referring now to FIG. 2, a simplified statistical process control diagram of a set of blanket oxide etches in a particular same plasma processing system over the course of a few weeks is shown, according to one embodiment of the invention. In general, quality in a plasma processing system refers to conformance to requirements. Conformance generally refers to the degree to which a substrate meets pre-established requirements or specifications in a recipe, such as targets, tolerances, etc.

In addition, any given plasma process may also include a degree of uncertainty, also known as variance. Generally, a decrease in variance is often directly correlated to an corresponding increase in quality. Some causes of variance are considered normal or acceptable, and do not necessarily call for action. For example, slight differences in a manufactured substrate caused by running the same process on difference plasma processing systems. That is, in an attempt to match one plasma processing system to another, variations are almost certain to occur. Other causes of variance are out of the ordinary or special. They are not an expected part of the process and hence may require some type of corrective action. That is, they exceed the boundaries of normal variation. For example, moisture in a plasma chamber which can destroy a substrate.

In this diagram, the target is a desired mean etch rate of about 110.52 nm/min, and tolerance refers to maintaining the etch rate within an upper control limit (ER UCL) of about 120.12 nm/min, and a lower control limit (ER LCL) of about 100.91 nm/min. This particular set of etches were performed in a Lam Research Exelan™ 2300 dual frequency plasma processing system, although other plasma processing systems may be used. The process parameters were as follows:

Pressure: 70 milli-torr

Power (2 MHz): 1000.0 Watts

Power (27 MHz): 2000.0 Watts

Gas Mixture: 5 SCCM $CH_2F_2$, 6 SCCM $C_4F_8$, 180 SCCM $N_2$ & 200 SCCM AR

Temperature: 80° C. at TP (top piece) & 20° C. at ESC

Process Time: 60 seconds

CW: 37

Plot 202 reflects the etch rate of the blanket oxide in nanometers per minute (nm/min) over the course of several weeks. In analyzing this diagram, two excursion points may become apparent: 204 performed on Apr. 6, 2004, and 206 performed on Apr. 9, 2004. As previously discussed, an excursion represents a data point that is outside of an established statistical range or value envelope, and may be caused by several factors (i.e., chamber contamination, plasma structural damage and deterioration, gas pressure leak, gas flow mixture problem, chamber temperature out of specification, bad RF cable, improperly connected cable, backside He flow, etc.).

Figure 3:
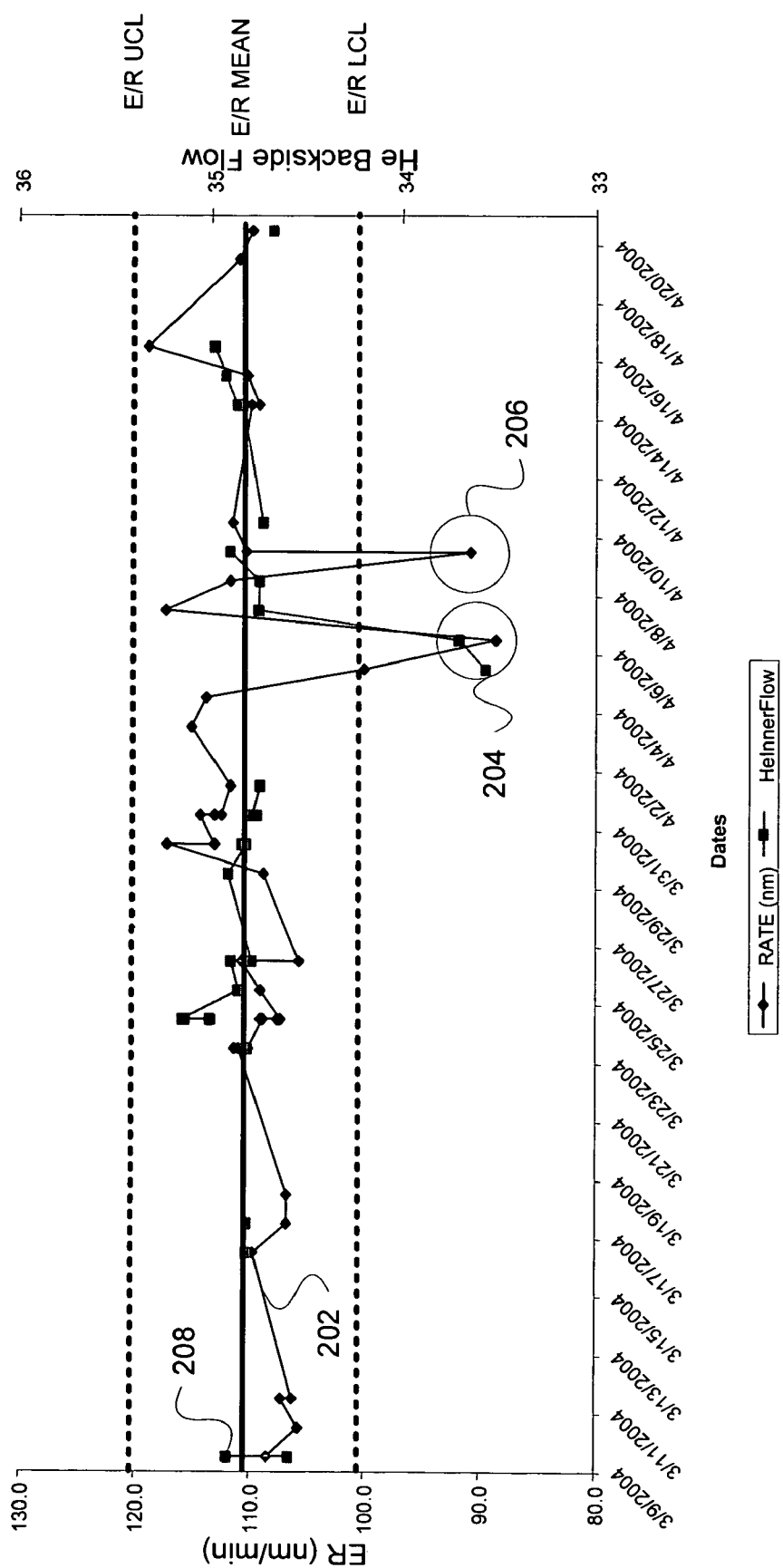
FIG. 3 shows the simplified diagram of FIG. 2, with the addition of the backside He flow plot, according to one embodiment of the invention.

Referring now to FIG. 3, the simplified diagram of FIG. 2 is shown, with the addition of the backside He flow plot, according to one embodiment of the invention. As before, plot 202 reflects the etch rate of the blanket oxide in nanometers per minute (nm/min) over the course of several weeks. Likewise, plot 208 reflects the corresponding measured backside He flow during each etch.

As shown on Apr. 6, 2004, both etch plot 202 and plot He flow plot 208 show excursions at 204. That is, as the He flow became reduced to about 33.5 SCCM, the etch rate also was substantially reduced to about 33.4 nm/min, substantially outside the 3σ lower control limit (LCL) of 100.91 nm/min.

Since both the etch rate and the He flow reflect excursions at the same point, this may imply a correlation. Hence, the He flow may be a substantive cause of the etch rate excursion on Apr. 6, 2004. In contrast, since a reduced etch plot 202 excursion on Apr. 9, 2004 of about 33.5 nm/min at 206 does not appear to be strongly correlated to a reduced He flow as at point 204, a reduced He flow is probably not a substantive cause of the etch rate excursion on Apr. 9, 2004.

Figure 4:
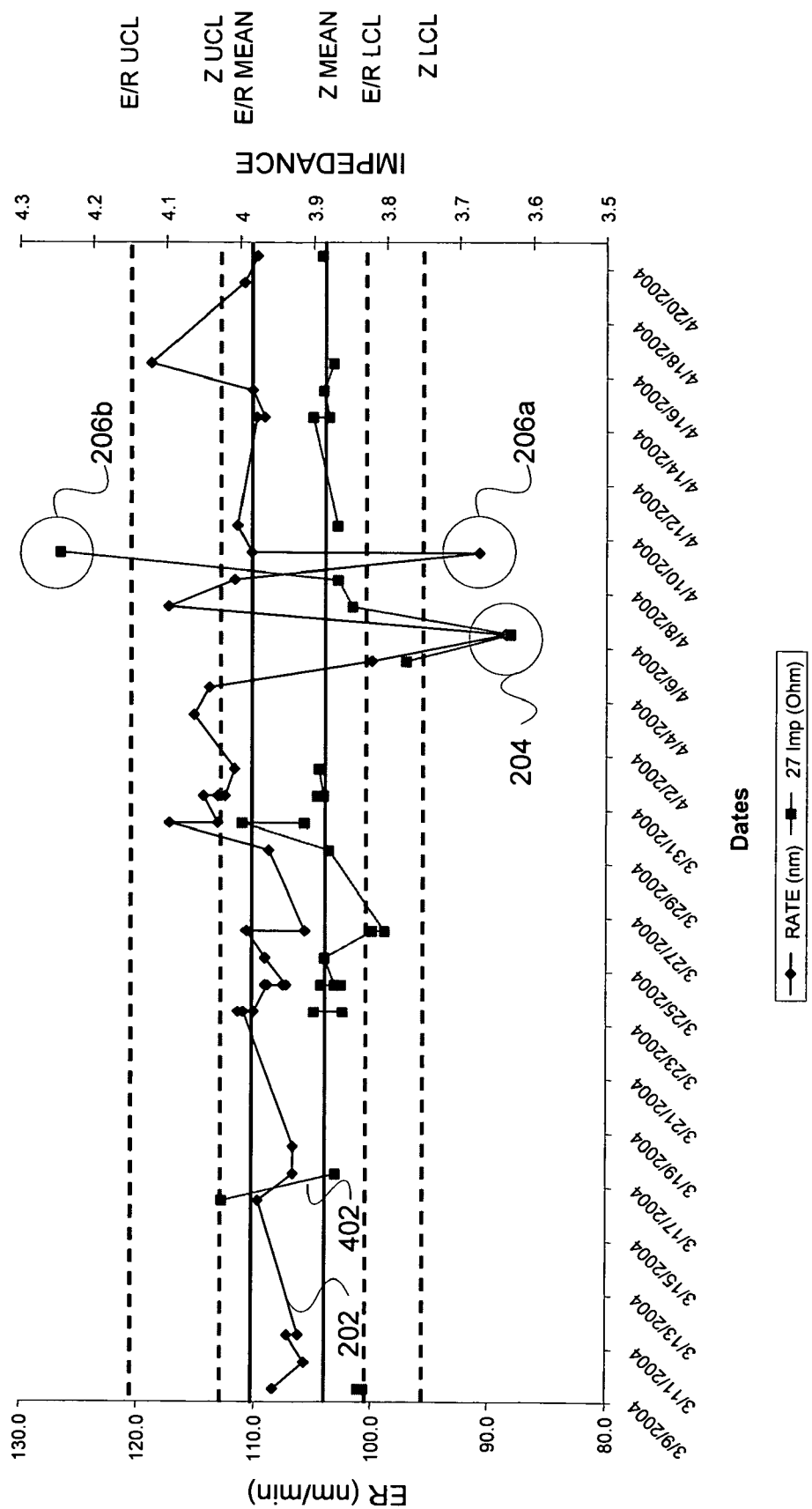
FIG. 4 shows the simplified diagram of FIG. 2, with the addition of the measured impedance for 27 MHz at the V/I probe, according to one embodiment of the invention.

Referring now to FIG. 4, the simplified diagram of FIG. 2 is shown, with the addition of the measured impedance for 27 MHz at the V/I probe is shown, according to one embodiment of the invention. As before, plot 202 reflects the etch rate of the blanket oxide in nanometers per minute (nm/min) over the course of several weeks. In addition, plot 402 reflects the corresponding measured impedance for 27 MHz.

As stated previously, the desired target etch rate is about 110.52 nm/min, with an upper control limit (ER UCL) of about 120.12 nm/min and a lower control limit (ER LCL) of about 100.91 nm/min. The desired target impedance is about 3.88 Ohms, with an upper control limit (Z UCL) of about 4.02 Ohms and a lower control limit (Z LCL) of about 3.75 Ohms. Both etch plot 202 and the measured impedance for 27 MHz 402 show excursions both around 204 on Apr. 6, 2004 and 206a-b on Apr. 9, 2004. Hence, an excursion in the measured impedance (whether above the Z UCL or below the Z LCL) appears to be correlated to a substantial reduction in the etch rate below the E/R LCL (i.e., an attribute excursion).

While not wishing to be bound by theory, the inventor believes that factors that may substantially alter a plasma impedance, may also tend to cause substantial changes in substrate attributes, such as the etch rate. These factors may include the deterioration of chamber materials (e.g., electrode, confinement ring, etc.), excursion of gas flow, gas pressure, or temperature, changes in substrate types, changes in the chuck surface, problems with the RF generator, an RF connection, a bad RF cable, etc.

Figure 5:
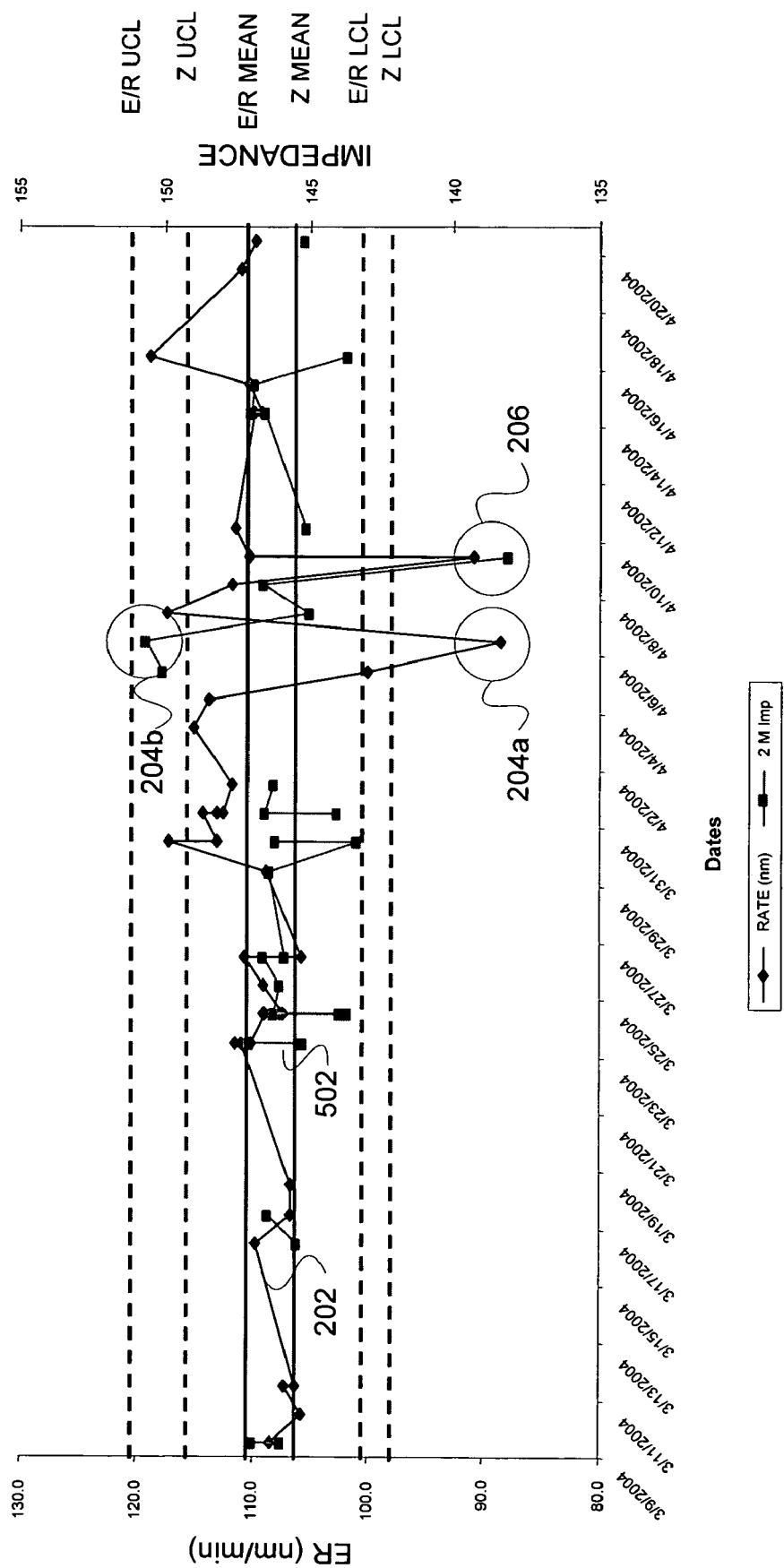
FIG. 5 shows the simplified diagram of FIG. 2, with the addition of the measured impedance for 2 MHz at the V/I probe, according to one embodiment of the invention.

Referring now to FIG. 5, the simplified diagram of FIG. 2 is shown, with the addition of the measured impedance for 2 MHz at the V/I probe is shown, according to one embodiment of the invention. As before, plot 202 reflects the etch rate of the blanket oxide in nanometers per minute (nm/min) over the course of several weeks. In addition, plot 502 reflects the corresponding measured impedance for 27 MHz.

As stated previously, the desired target etch rate is about 110.52 nm/min, with an upper control limit (ER UCL) of about 120.12 nm/min and a lower control limit (ER LCL) of about 100.91 nm/min. The desired target impedance is about 145.73 Ohms, with an upper control limit (Z UCL) of about 149.16 Ohms and a lower control limit (Z LCL) of about 142.29 Ohms.

Both etch plot 202 and the measured impedance for 2 MHz 402 show excursions both around 204a-b on Apr. 6, 2004 and 206 on Apr. 9, 2004. As in FIG. 5, an excursion in the measured impedance (whether above the Z UCL or below the Z LCL) appears to be correlated to a substantial reduction in the etch rate below the E/R LCL (i.e., an attribute excursion).

Figure 6:
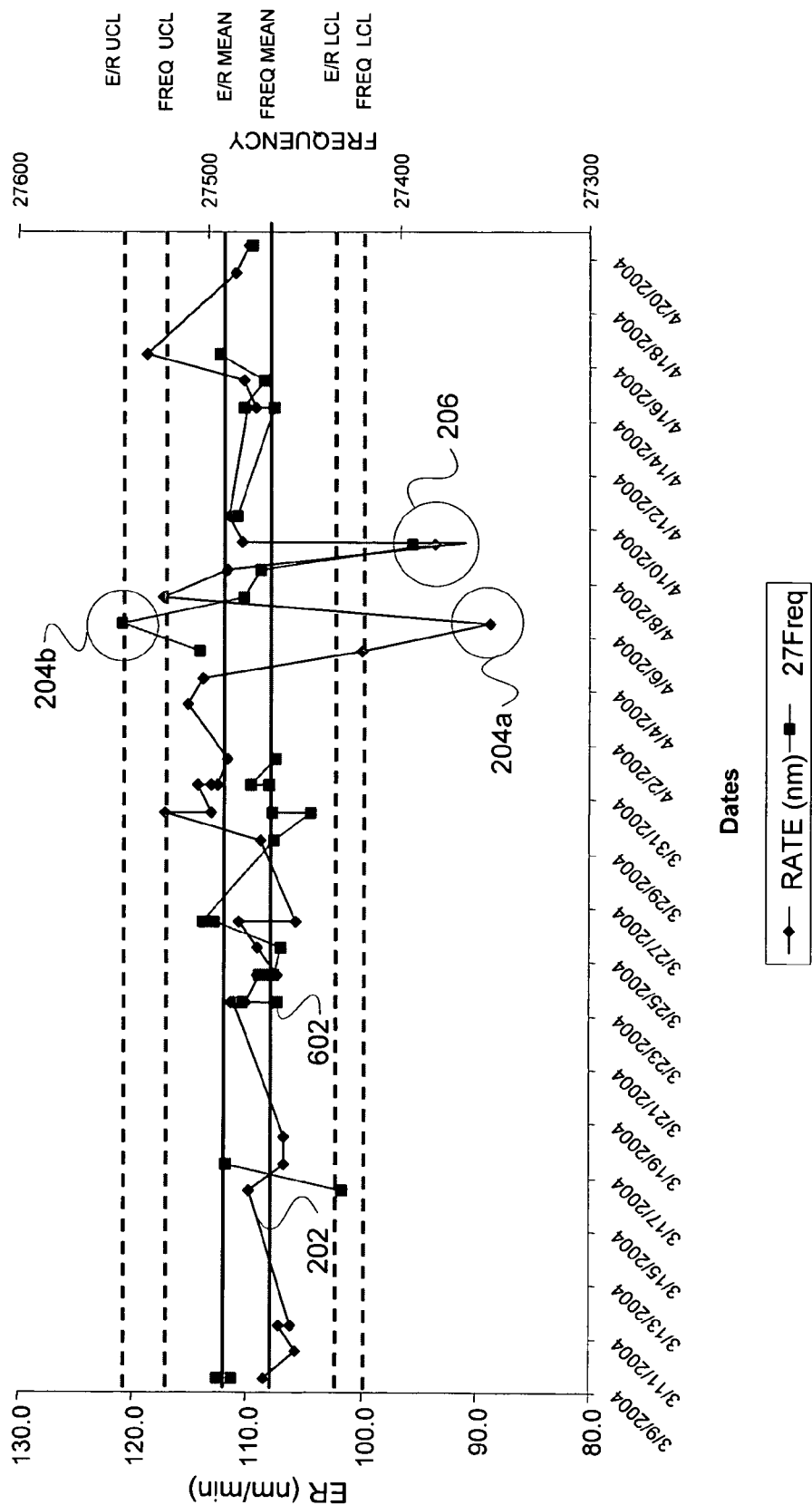
FIG. 6 shows the simplified diagram of FIG. 2, with the addition of the measured frequency for 27 MHz at the V/I probe, according to one embodiment of the invention.

Referring now to FIG. 6, the simplified diagram of FIG. 2 is shown, with the addition of the measured frequency for 27 MHz at the V/I probe is shown, according to one embodiment of the invention. As previously described, frequency-tuned plasma systems can modify a set of frequencies used to generate the plasma in order to minimize the reflected power during a process. As a result, the frequency changes as a response to the changes in plasma impedance.

As before, plot 202 reflects the etch rate of the blanket oxide in nanometers per minute (nm/min) over the course of several weeks. In addition, plot 602 reflects the corresponding measured frequency for 27 MHz. As stated previously, the desired target etch rate is about 110.52 nm/min, with an upper control limit (ER UCL) of about 120.12 nm/min and a lower control limit (ER LCL) of about 100.91 nm/min. The desired target frequency for 27 MHz is about 27.47680 MHz, with an upper control limit (FREQ UCL) of about 27.52331 MHz and a lower control limit (FREQ LCL) of about 27.43029 MHz. Both etch plot 202 and the measured frequency for 27 MHz 602 show excursions both around point 204a-b at Apr. 6, 2004 and points 206 at around Apr. 9, 2004. In the illustrated diagram, an excursion is defined as a point beyond 3 standard deviations (3σ) of the plot mean. Hence, an excursion in the measured frequency (whether above the FREQ UCL or below the FREQ LCL) appears to be correlated to a substantial reduction in the etch rate below the E/R LCL (i.e., an attribute excursion).

Figure 7:
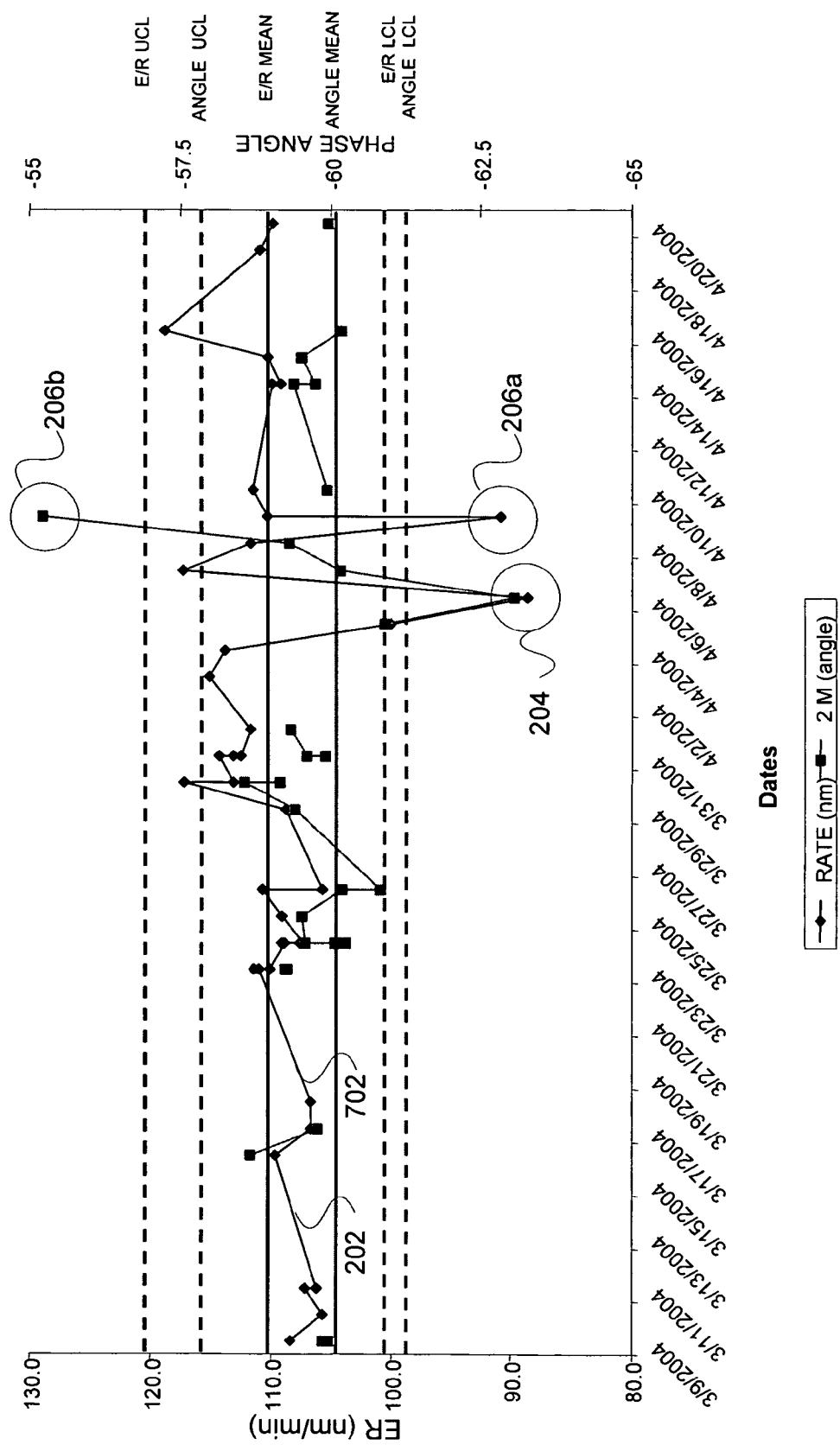
FIG. 7 shows the simplified diagram of FIG. 2, with the addition of the measured impedance phase angle at the V/I probe, according to one embodiment of the invention.

Referring now to FIG. 7, the simplified diagram of FIG. 2 is shown, with the addition of the measured impedance phase angle at the V/I probe is shown, according to one embodiment of the invention. As before, plot 202 reflects the etch rate of the blanket oxide in nanometers per minute (nm/min) over the course of several weeks. In addition, plot 702 reflects the corresponding measured phase angle for impedance.

As stated previously, the desired target etch rate is about 110.52 nm/min, with an upper control limit (ER UCL) of about 120.12 nm/min and a lower control limit (ER LCL) of about 100.91 nm/min. The desired target of the measured impedance phase angle is about −59.67°, with an upper control limit (ANGLE UCL) of about −58.17°, and a lower control limit (ANGLE LCL) of about −61.16°.

Both etch plot 202 and the measured phase angle 702 show excursions both around point 204 at Apr. 6, 2004 and point 206a-b at around Apr. 9, 2004. In diagram, an excursion is defined as a point beyond 3 standard deviations (3σ) of the plot mean. Hence, an excursion in the measured phase angle (whether above the ANGLE UCL or below the ANGLE LCL) appears to be correlated to a substantial reduction in the etch rate below the E/R LCL (i.e., an attribute excursion).

Figure 8:
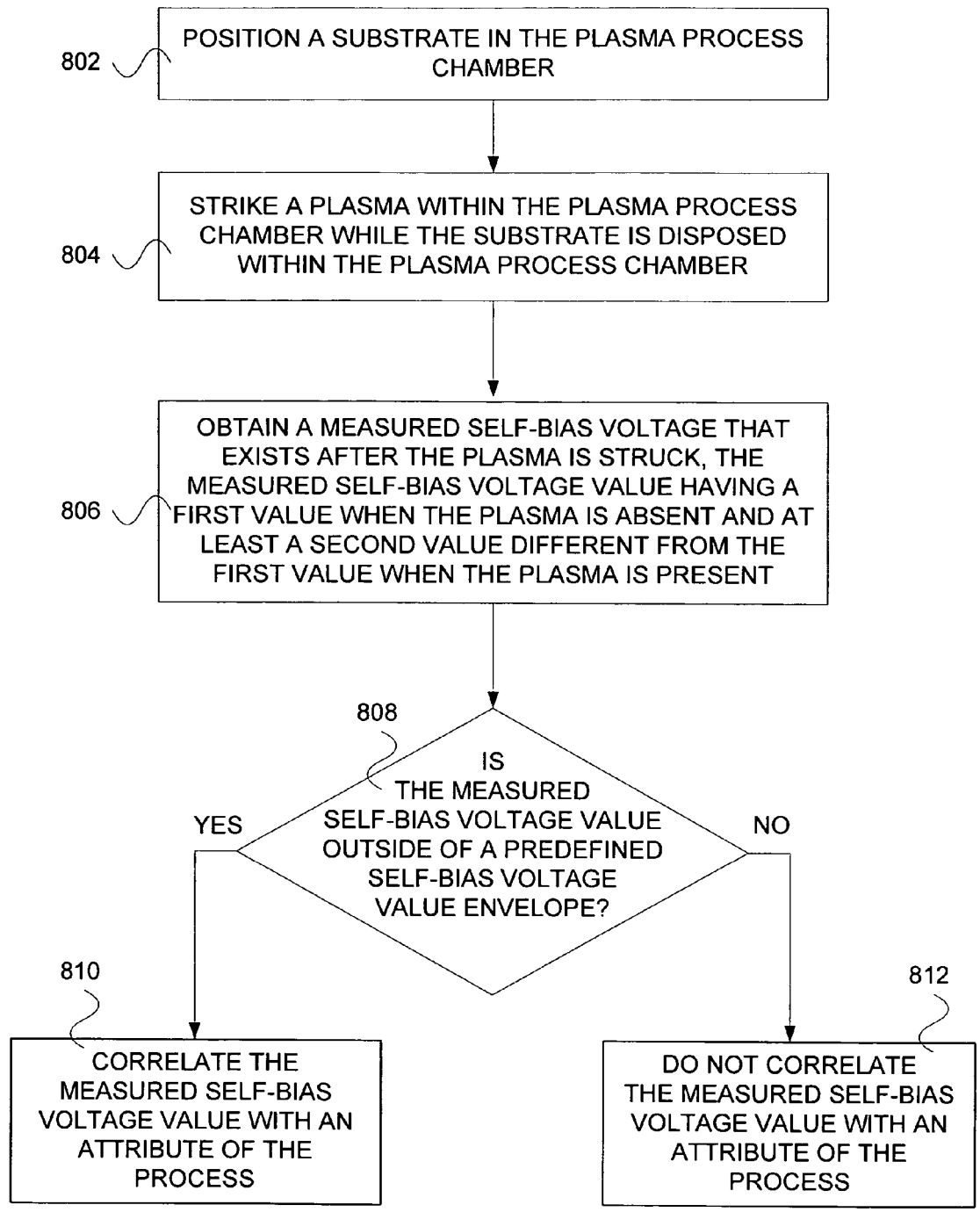
FIG. 8 shows a simplified diagram of a method for the in-situ monitoring of a process, according to one embodiment of the invention.

Referring now to FIG. 8, a simplified diagram is shown of a method for the in-situ monitoring of a process in a plasma processing system having a plasma processing chamber, according to one embodiment of the invention. Initially, a substrate is positioned in the plasma processing chamber, at step 802. Next, a plasma is struck within the plasma processing chamber while the substrate is disposed within the plasma processing chamber, at step 804. A measured self-bias voltage that exists after the plasma is struck is then obtained, the measured self-bias voltage value having a first value when the plasma is absent and at least a second value different from the first value when the plasma is present, at step 806. If the measured self-bias voltage value is outside of a predefined self-bias voltage value envelope, at step 808, then the measured self-bias voltage value is correlated with an attribute of the process, at step 810. If not, then the measured self-bias voltage value is not correlated with an attribute of the process, at step 812.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used (e.g., capacitively coupled, inductively coupled, atmospheric, etc.) This invention may also be used with substrates of various diameters (e.g., 200 mm, 300 mm, etc). It should also be noted that there are many alternative ways of implementing the methods of the present invention.

Advantages of the invention include methods and apparatus for monitoring a process in a plasma processing system by measuring self-bias voltage. Additional advantages include the use of a substantially reliable signal that can be used for diagnostics or monitoring purposes.

Having disclosed exemplary embodiments and the best mode, modifications and variations may be made to the disclosed embodiments while remaining within the subject and spirit of the invention as defined by the following claims.

What is claimed is:

1. A method for in-situ monitoring an attribute of a substrate in a plasma processing system having a plasma processing chamber, the method comprising:
    positioning said substrate in said plasma processing chamber;
    striking a plasma within said plasma processing chamber while said substrate is disposed within said plasma processing chamber;
    measuring a self-bias voltage between said substrate and said plasma; and
    if a measured self-bias voltage value of said self-bias voltage is outside of a predefined self-bias voltage value envelope, deducing that an excursion of said attribute of said substrate has occurred.

2. The method of claim 1 wherein said plasma is generated at a specific RF frequency.

3. The method of claim 2 wherein said specific RF frequency is about 2 MHz.

4. The method of claim 2 wherein said specific RF frequency is about 27 MHz.

5. The method of claim 2 wherein said specific RF frequency is about 13.56 MHz.

6. The method of claim 1 wherein said plasma processing system includes a V/I probe, and said measured self-bias voltage value is measured using said V/I probe.

7. The method of claim 1 wherein said measured self-bias voltage value represents a value of a phase angle measurement.

8. The method of claim 1 wherein said measured self-bias voltage value represents a value of an amplitude measurement.

9. The method of claim 1 wherein said predefined self-bias voltage value envelope includes a self-bias voltage lower control limit.

10. The method of claim 9 wherein said self-bias voltage lower control limit is within $3\sigma$ of a predefined self-bias voltage target value.

11. The method of claim 1 wherein said predefined self-bias voltage value envelope includes a self-bias voltage upper control limit.

12. The method of claim 11 wherein said self-bias voltage upper control limit is within $3\sigma$ of a predefined self-bias voltage target value.

13. The method of claim 1 wherein said predefined self-bias voltage value envelope includes a self-bias voltage lower control limit and a self-bias voltage upper control limit.

14. The method of claim 1 wherein said substrate is a semiconductor wafer.

15. The method of claim 1 wherein said substrate is a glass panel.

16. The method of claim 1 wherein said attribute of said substrate represents an etch rate while etching said substrate.

17. The method of claim 1 wherein said attribute of said substrate represents a selectivity rate while etching said substrate.

18. The method of claim 1 wherein said attribute of said substrate represents a etch uniformity measurement while etching said substrate.

19. The method of claim 1 wherein said plasma processing system is a capacitively coupled plasma processing system.

20. The method of claim 1 wherein said plasma processing system is an inductively coupled plasma processing system.

21. The method of claim 1 wherein said plasma processing system is an atmospheric plasma processing system.

22. The method of claim 1 wherein said plasma processing system is a frequency-tuned coupled plasma processing system.

23. The method of said claim 1 wherein said excursion of said attribute of said substrate represents a reduction of an etch rate of said substrate.

24. A method for determining whether a plasma parameter is suitable to be used as an excursion indicator for a substrate attribute in a plasma processing system, the method comprising:
    processing a substrate in said plasma processing system for a period of time, said substrate attribute pertaining to said processing said substrate;
    measuring said substrate attribute during said period of time;
    measuring said plasma parameter during period of time; and
    if one or more measured plasma parameter values of said plasma parameter remain within a predefined plasma parameter value envelope when one or more measured substrate attribute values are outside of a predefined attribute value envelope, determining that said plasma parameter is not suitable to be used as said excursing indicator for said substrate attribute.

25. The method of claim 24 wherein said plasma parameter represents at least one of an impedance, a phase angle, a plasma frequency, a self-bias voltage, and a gas flow rate.

26. The method of claim 24 wherein said plasma parameter represents a self-bias voltage between said substrate and a plasma for said processing.

27. The method of claim 24 wherein said plasma parameter represents a flow rate of a gas pertaining to said processing.

28. The method of claim 24 wherein said substrate attribute represents an etch rate of said substrate.

29. The method of claim 24 wherein said excursion indicator is for indicating a reduction of an etch rate of said substrate.

30. The method of claim 24 wherein said one or more measured plasma parameter values represent one plasma parameter value, and said one or more measured substrate attribute values represent one measured substrate attribute value.

31. The method of claim 24 wherein said one or more measured plasma parameter values represent a plurality of plasma parameter values, and said one or more measured substrate attribute values represent a plurality of measured substrate attribute values.

32. The method of claim 24 wherein said period of time includes a plurality of weeks.

* * * * *